(12) United States Patent
Abdo et al.

(10) Patent No.: US 12,439,834 B2
(45) Date of Patent: Oct. 7, 2025

(54) SOLDER-SHIELDED CHIP BONDING

(71) Applicant: INTERNATIONAL BUSINESS MACHINES CORPORATION, Armonk, NY (US)

(72) Inventors: Baleegh Abdo, Fishkill, NY (US); Jae-Woong Nah, Closter, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 243 days.

(21) Appl. No.: 18/069,996

(22) Filed: Dec. 21, 2022

(65) Prior Publication Data

US 2024/0215460 A1  Jun. 27, 2024

(51) Int. Cl.
  *H10N 60/81* (2023.01)
  *H10N 60/01* (2023.01)
  *H10N 60/82* (2023.01)
  *H10N 69/00* (2023.01)

(52) U.S. Cl.
  CPC .............. *H10N 60/81* (2023.02); *H10N 60/01* (2023.02); *H10N 60/82* (2023.02); *H10N 69/00* (2023.02)

(58) Field of Classification Search
  None
  See application file for complete search history.

(56) References Cited

U.S. PATENT DOCUMENTS

| | | |
|---|---|---|
| 8,552,539 B1 | 10/2013 | Foster |
| 9,595,454 B2 | 3/2017 | Huang et al. |
| 9,971,970 B1 | 5/2018 | Rigetti et al. |
| 10,424,711 B2 | 9/2019 | Schoelkopf, III et al. |
| 10,769,546 B1 | 9/2020 | Rigetti et al. |
| 2021/0272976 A1 | 9/2021 | Huo et al. |
| 2021/0288022 A1 | 9/2021 | Bernier et al. |
| 2022/0158068 A1 | 5/2022 | Gates et al. |

OTHER PUBLICATIONS

Clarke, J. et al., "Tunnel Junction DC Squid: Fabrication, Operation, and Performance"; downloaded from: https://escholarship.org/uc/item/1g67p1gg, Journal of Low Temperature Physics (1975), 95 pgs.

*Primary Examiner* — Matthew L Reames
(74) *Attorney, Agent, or Firm* — Amin, Turocy & Watson, LLP (57) ABSTRACT

A structure includes a first device having a first chip and a second chip. The second chip has a first side with a plurality of bumps and a second side with a plurality of first superconducting lines. A solder bonded layer attaches the first chip to the second chip. A second device has a first side with a plurality of pads facing the plurality of bumps in the second chip and a second side opposite the first side having a plurality of second superconducting lines. A solder shield material surrounds the plurality of bumps and the plurality of pads, and the plurality of bumps on the second chip are bonded to the plurality of pads on the second device. The solder shield material is connected to the plurality of first superconducting lines of the first device and to the plurality of second superconducting lines of the second device.

10 Claims, 7 Drawing Sheets

SOLDER-SHIELDED CHIP BONDING

BACKGROUND

Technical Field

The present disclosure generally relates to packaging for quantum superconducting devices, and more particularly, to enclosures for superconducting devices.

Description of the Related Art

Packaging for quantum limited amplifiers, superconducting microwave devices, Josephson mixers, Josephson isolators, and/or quantum superconducting device generally use oxygen free high conductivity copper (OFHC) that is large in size and does not provide for magnetic field shielding for packaged superconducting devices.

SUMMARY

According to one embodiment, a structure includes a first device having a first chip and a second chip, the second chip has a first side with a plurality of bumps and a second side with a plurality of first superconducting lines. A solder bonded layer attaches the first chip to a second side of the second chip opposite the first side. A second device has a first side with a plurality of pads facing the plurality of bumps in the second chip and a second side of the second device opposite the first side having a plurality of superconducting lines. A solder shield material surrounds the plurality of bumps and the plurality of pads, and the plurality of bumps on the second chip are bonded to the plurality of pads on the second device. The solder shield material is connected to the plurality of first superconducting lines of the first device and to the plurality of second superconducting lines of the second device.

In one embodiment, the second chip is a qubit chip.

In one embodiment, the first chip is a handler wafer having a first attachment surface including a metal deposition layer. The qubit chip has a second attachment surface including a metal deposition layer, and the first attachment surface of the handler wafer and the second attachment surface of the qubit chip are bonded by the solder bonded layer located between the first attachment surface and the second attachment.

In one embodiment, the solder shield material is a superconducting material.

In one embodiment, the second device has metal lines or planes inside layers.

In one embodiment, the second device includes entry and exit points for passage of microwave signals to the qubit chip.

In one embodiment, the metal lines or planes within the second device shield material is a superconducting material.

In one embodiment, the plurality of bump bonds are constructed of a superconducting material.

In one embodiment, a solder shield side wall a solder shield side wall has a first end disposed on the first device.

In one embodiment, the solder shield side wall includes a second end connected to the second superconducting lines of the second device.

According to one embodiment, a method of manufacturing a conductive enclosure includes forming on a first device a metallic ground plane on at least one side of a first wafer and a side of a second wafer. The ground plane is attached to sides of the first wafer and the second wafer via a solder shield material. A solder line is added to the perimeter of an attachment area of a second device, and the second wafer is attached to the attachment area of the second device by bump bonding.

In one embodiment, the attaching of the first wafer and the second wafer, and the adding of the solder line to the perimeter of the attachment area of the second device is performed with a superconducting solder shield material.

In one embodiment, the method further includes performing an edge trimming operation on the second wafer to expose the solder shield material along a side of the second wafer, and dicing the attached first wafer and the second wafer into two or more chips.

In one embodiment, the bump bonding to the second device includes reflowing in formic acid the bump bonds attached to the first device.

In one embodiment, the bump bonding to the second device includes reflowing with flux the bump bonds attached to the first device.

In one embodiment, entry and exit points are included in the solder lines of the second device for passage of microwave signals to at least one of the chips.

According to one embodiment, a method of manufacturing a conductive enclosure includes connecting a qubit chip to the second device with a plurality of bump bonds and surrounding the plurality of bump bonds with a superconducting solder shield material.

In one embodiment, the solder shield material in the solder lines are arranged in the second device below the plurality of bump bonds. The solder shield material is arranged to span from above the qubit chip to sidewalls connected to the solder lines in the first device.

In one embodiment, the adding of exit and entry points are provided in the solder lines of the second device for a passage of microwave signals to the qubit chip.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements or more elements than shown and described.

As used herein, the terms "first device" and "second device" are to be interpreted broadly. The first device may be a semiconductor chip, a PCB, a laminate, an interposer, or a wiring, just to name some non-limiting examples. The second device may be a superconducting device, or a qubit chip, just to name a few non-limiting examples. The term "PCB" is to be interpreted broadly and may refer to either a printed circuit board and/or a laminate layer(s) used in PCB construction. Laminates may include, but are not in any way limited to, FR4, high performance FR4, FR5, and flexible substrates made of polymers like polyimide, polyethylene terephthalate (PET).

Figure 1:
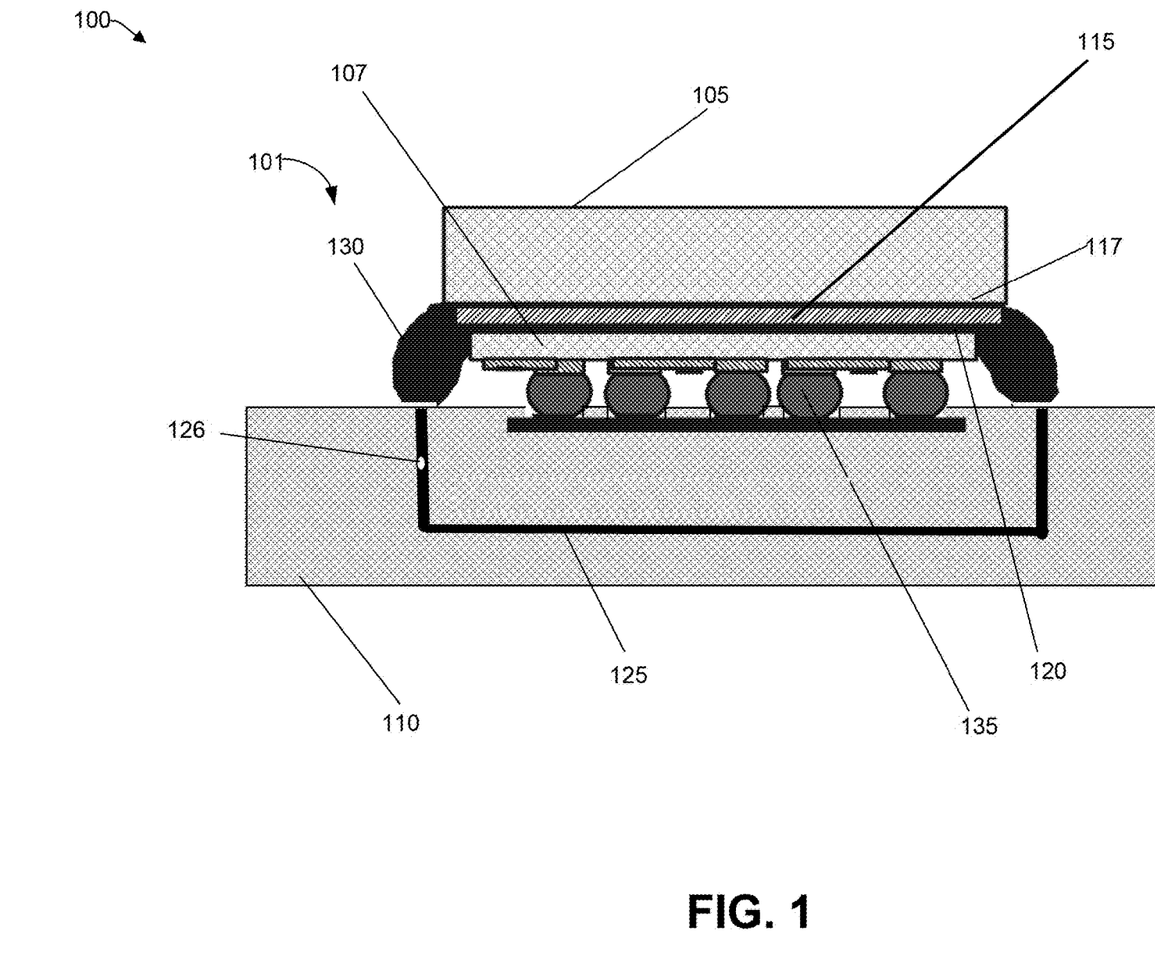
FIG. 1 is an overview of a conductive enclosure, consistent with an illustrative embodiment.

FIG. 1 is an overview 100 illustrating a conductive enclosure 101, consistent with an illustrative embodiment. In this embodiment, a first chip 105 is bonded to a second chip 107. For example, the first chip 105 may be a handler wafer, and the second chip 107 may be a qubit chip. The second chip 107 may be arranged on an interposer, wiring, semiconductor, or a printed circuit board (PCB) or a laminate 110 etc., by a plurality of bump bonds 135. The enclosure includes a ground plane constructed of a first metal deposition layer 117 on the first chip 105, a second metal deposition layer 120 on the second chip 107, and a solder material, such as the solder bonded layer 115, arranged between the first and second metal deposition layers 117, 120. A solder shield sidewall 130 serves as part of the enclosure of the second chip 107. The ground plane is in contact with the solder shield sidewalls 130 and conductive lines or planes 125 to seal the qubit chip 107 within the structure.

As disclosed herein, the conductive lines or planes 125 may have exit and entry points (e.g., openings) 126 that are sized for the passage of microwave signals to/from the qubit chip 107 and/or to components (not shown) connected to the qubit chip 107. The term "sized for passage of microwave signals" is to be understood as the entry points being large enough to permit microwave signals at a particular microwave frequency, or range of frequencies to pass through the entry points to circuitry on the second wafer 107. For example, the exit and entry points 126 may be sized in the tens of microns. A first size range may be 10-50 microns. A second range may be 10-100 microns, and depending on the frequencies used, may be a 50-100 micron range. It is to be understood that the exit and entry points 126 may be used in lieu of a feedline such as a waveguide. The entry points are sized in the range of tens of microns to permit passage of microwave transmissions yet act as a cut-off for lower frequency transmissions, magnetic fields and other types of noise that may affect operation of the circuits in the second wafer 107. The entry and exit points 126 may be provided by the use of a stencil when the solder lines 125 are formed. However, any other method (e.g., a laser) of construction may be used to make the openings that serve as the exit and entry points 126.

In an embodiment, the conductive enclosure may be formed of highly conductive metallic materials. In another embodiment, which may be combined with other embodiments, the conductive enclosure may be formed by layers of superconducting metallic materials that are produced using standard industrial fabrication and packaging technologies. Advantageously, the conductive enclosure can be widely applied at scale.

Other advantages include the conductive structure is physically attached to the chip (e.g., a qubit chip) and PCB with no need for assembly or disassembly. The conductive enclosure is also lighter than conventional oxygen free high conductivity (OFHC) copper packages. In one aspect, the conductive structure disclosed herein provides protection against microwave radiation loss as well as magnetic field shielding for the packaged superconducting devices (such as qubit chips), which provides an advantage over an OFHC copper package.

When the conductive enclosure such as shown in FIG. 1 is constructed of superconducting solder, bump bonds, and a ground plane, the whole enclosure may be superconducting. The conductive enclosure as disclosed herein may provide certain protection for the superconducting devices (e.g., second chip 107) against magnetic fields. In addition, a thermal contact is formed between the second device and a mounting bracket to the mixing chamber of the dilution fridge housing.

The conductive enclosure and the method of construction of the present disclosure provides at least the above-discussed advantages. The improvement in shielding provides improved performance of the superconducting devices.

Additional advantages of the present disclosure are disclosed herein.

Example Embodiment

Figure 2:
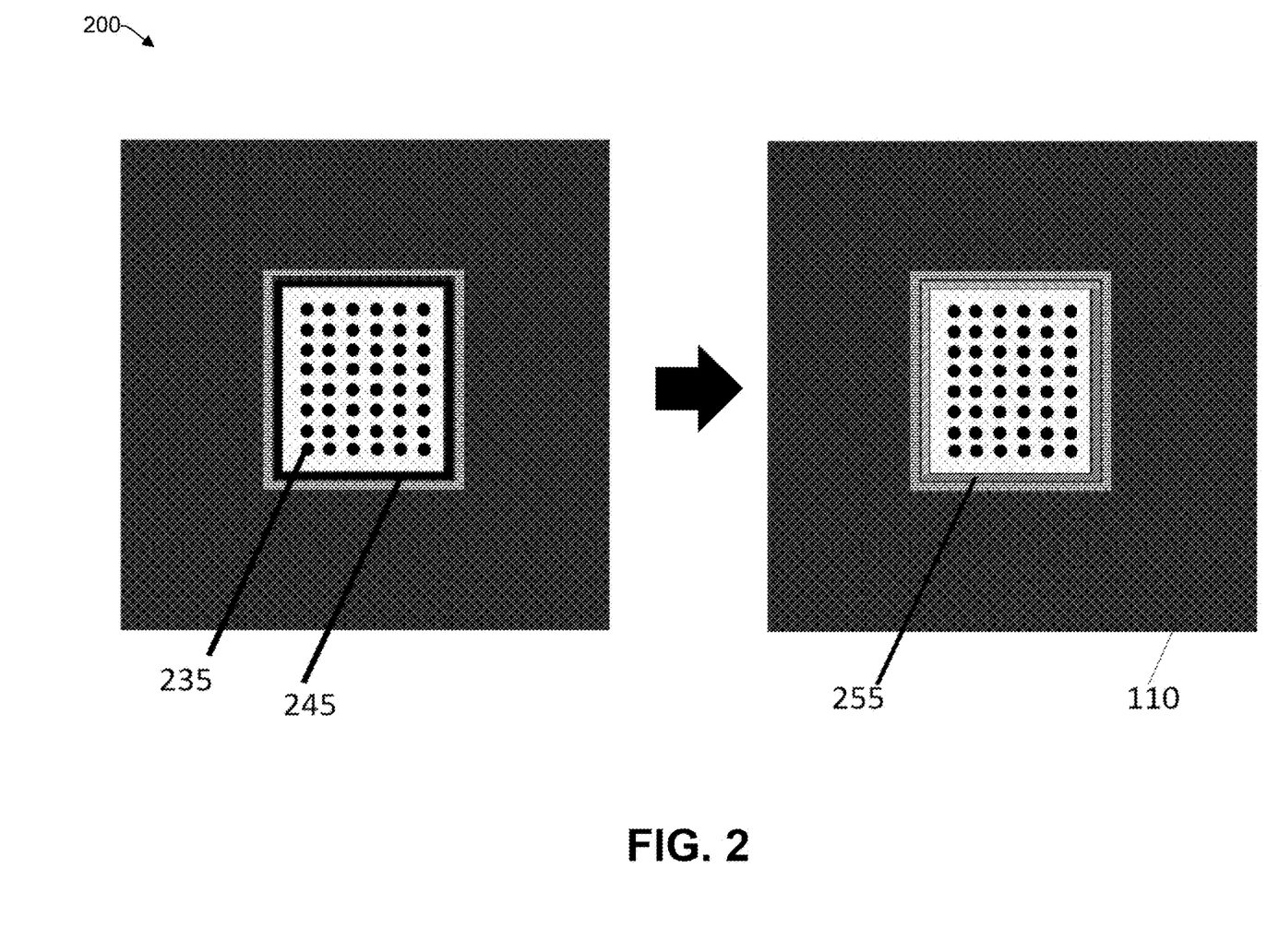
FIG. 2 shows the construction of a printed circuit board with solder lines, consistent with an illustrative embodiment.

FIG. 2 shows the stages 200 of construction of a second device with solder lines, consistent with an illustrative embodiment. FIG. 2 shows a second device 110 such as shown in FIG. 1. Alternatively, the second device 110 may include but is not in any way limited to a second device, a laminate structure, an interposer, or a semiconductor. A pad 235 is shown on the second device for joining with the solder bumps 135 on the qubit chip 107 (see FIG. 1). The pad may be made of a material including, but not limited to, Copper, Nickel-phosphorus, Platinum, Palladium, Titanium, Niobium, Aluminum, Gold, Silver, or other types of material that can react with the solder material being used.

Still referring to FIG. 2, the second device 110 has solder wetting lines 245 having the same metal layers as the pad 235. Here is a formation of solder lines 255 using a process including but not limited to injection molded solder (IMS), electroplating, paste printing, used with, for example, solder preforms. The solder can be fluxed or cored. In the case of solder paste, the type of flux should be the same as the solder preform. The solder preforms may be constructed from In, InSn, InAg, Sn, PbSn, etc., just to name a few non-limiting types.

Figure 3:
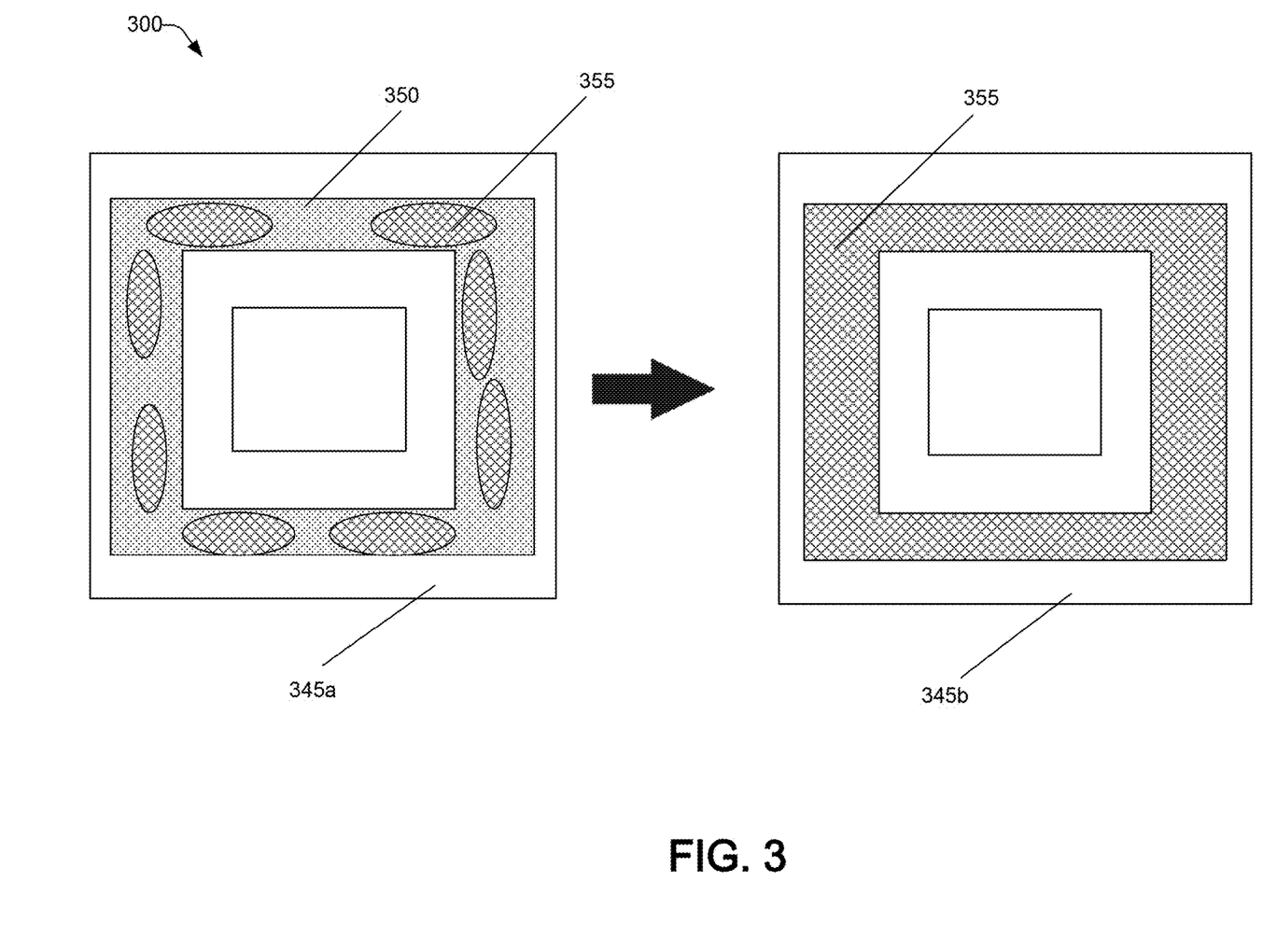
FIG. 3 illustrates arrangement of a solder line on a substrate, consistent with an illustrative embodiment.

FIG. 3 illustrates an arrangement 300 of a solder line on a substrate, consistent with an illustrative embodiment.

There is shown on the left side of the drawing a substrate 345a having a gold (Au) finish 350 with a several portions of a PbSn wire 355, and a substrate 345b on the right is shown after the PbSn alloy is reflowed with flux. The PbSn is the shielding material that will form the solder shield side wall 130 on the second device (FIG. 1 and FIG. 4) below the qubit chips, forming the lower portion of the enclosure. It is to be understood that other solder compositions are possible. In addition, a formic acid reflow may be performed rather than flux reflow.

Figure 4:
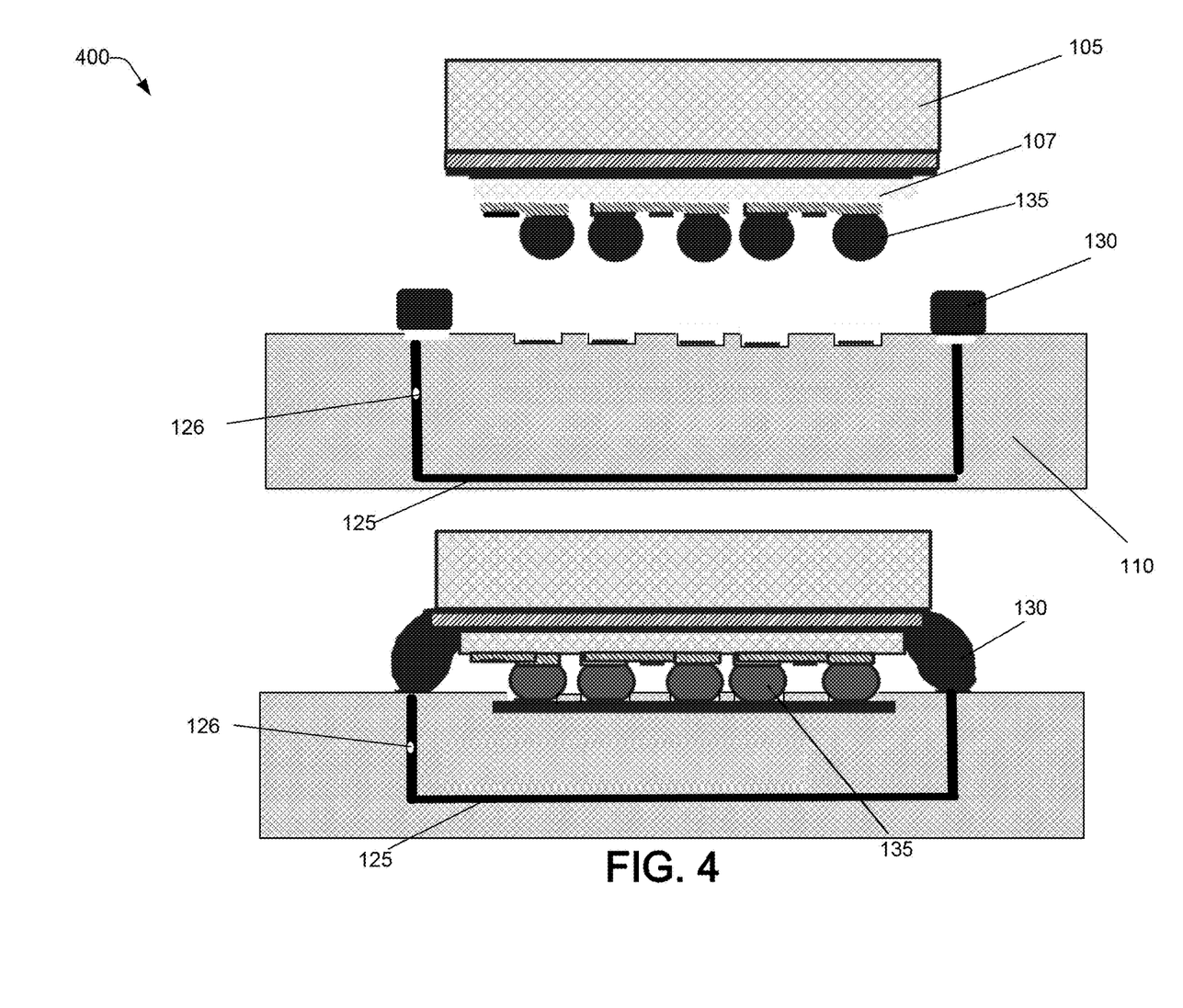
FIG. 4 shows the arrangement of a superconducting device on a printed circuit board, consistent with an illustrative embodiment.

FIG. 4 shows the bonding arrangement of superconducting device 400 consistent with an illustrative embodiment. It is to be understood that although FIG. 4 shows a qubit chip on a second device, other superconductive device may be arranged on the second device in place of or in addition to the qubit chip. More particularly, FIG. 4 shows the bonded chip arrangement, such as the first chip 105 and the qubit chip 107. The conductive lines or planes 125 are attached to the solder sidewalls 130. It can be seen that the chip is first aligned over a substrate (second device 110) so that the solder bumps 135 are positioned to be in contact with the pads 235 on the second device 110. The chip structure is then attached to the second device 110 by wetting the solders 135 on metals 235 and the solders 130 on metals such as the solder bonded layer 115 so that the solder bumps 135 and the solder side wall 130 are bonded at the same time. This attachment can be performed by any of reflow of the solder in formic acid, reflow of the solder with flux, thermal compression bonding of the solder, or cold welding of the solder. It is to be understood that there may be other ways to bond the solder bumps to the pad in addition to the examples disclosed herein.

Figure 5A:
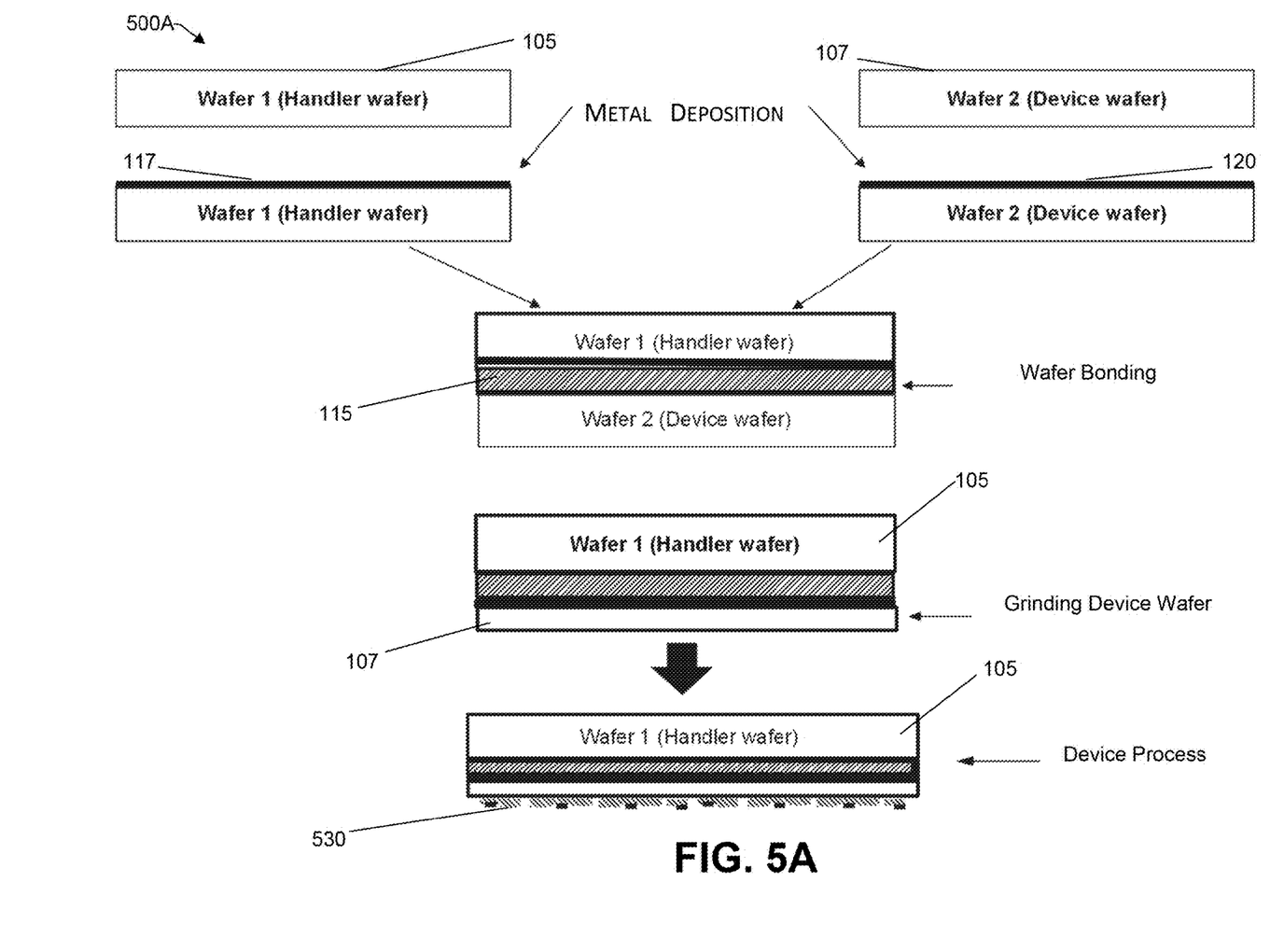
FIG. 5A is a flow diagram illustrating the construction of a conductive enclosure, consistent with an illustrative embodiment.
Figure 5B:
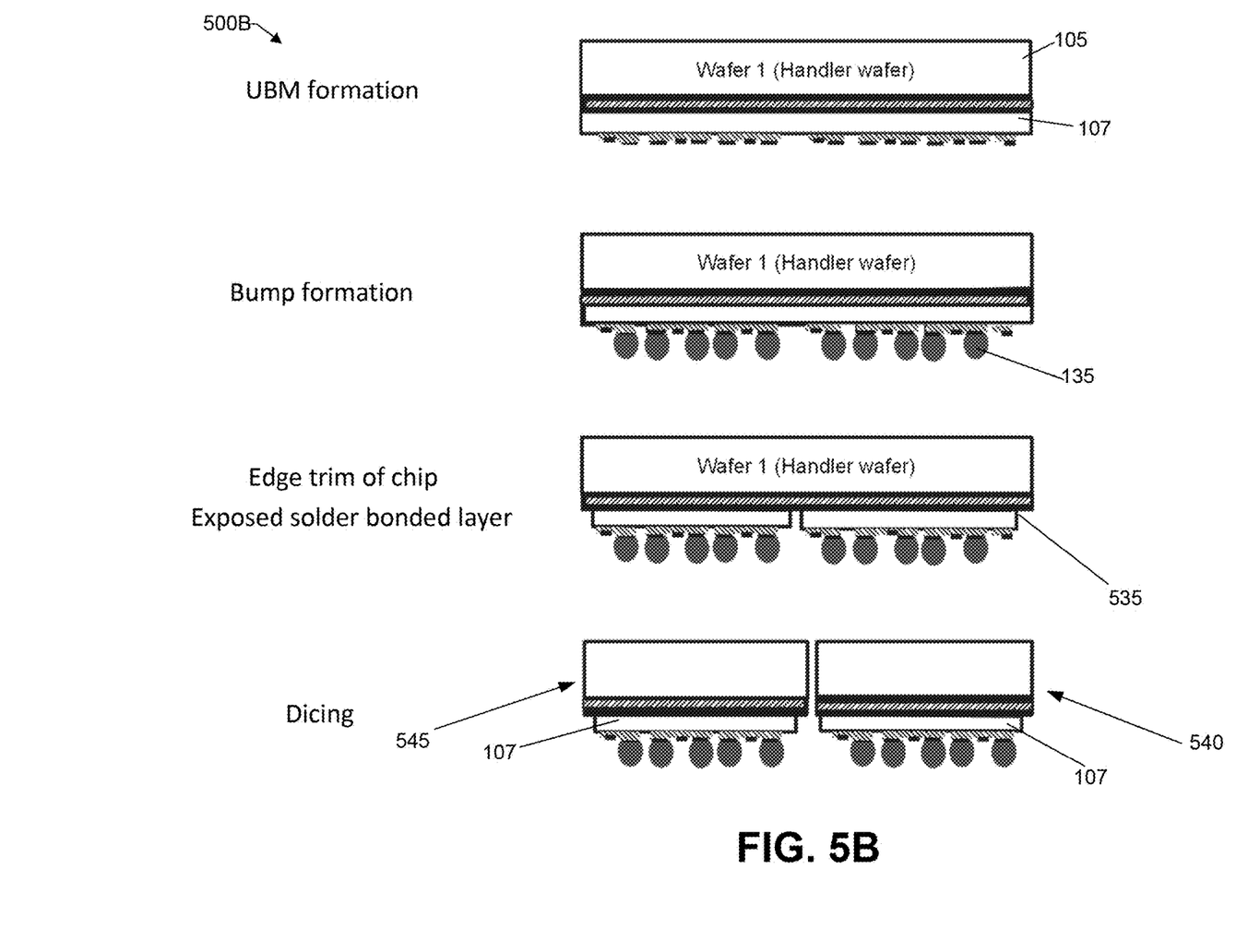
FIG. 5B is a flow diagram illustrating the construction of a conductive enclosure in which the wafer is diced into chips, consistent with an illustrative embodiment.

FIG. 5A is a flow diagram 500A illustrating the construction of a conductive enclosure, consistent with an illustrative embodiment, and FIG. 5B is a flow diagram illustrating the construction of a conductive enclosure in which the wafer is diced into chips, consistent with an illustrative embodiment. Although the flow diagrams show that the device wafer (e.g., qubit chip) may be thinned by being subjected to a grinding process, the present disclosure is not limited to such a construction. For example, the two wafers may be bonded together and devices added without performing the grinding operation (e.g., FIG. 5A).

FIG. 5A first shows a metal deposition operation for the first wafer 105 (e.g., a handler wafer) and the second wafer 107 (e.g., qubit chip, and/or a device wafer). Metal 117 is deposited on the first wafer 105, and metal 120 is deposited on the second wafer 107. Metals 117 and 120 are typically the same metal, but they may be different metals. The deposited metal may be, for example, titanium, platinum, Ruthenium, gold, silver and/or a metal that can react with the solder to be used. Other metals or alloys may be used.

The first wafer 105 and the second wafer 107 are then bonded together by the solder bonded layer 115. The solder may be a superconducting solder. Some possible solder materials are Sn, SnAg, SnAgCu, PbSn, InSn, InAg, and InBi, just to name a few non-exhaustive examples.

The second wafer 107 may then undergo an optional grinding process. It is shown in FIG. 5A that the size of the second wafer 107 is reduced. The grinding process may be performed by an annular material such as a diamond. Next, a device process is performed where circuitry 530 is formed on the wafer 107.

FIG. 5B is a continuation of the flow diagram 500B of FIG. 5A, consistent with an illustrative embodiment. An under bump metallization (UBM) formation operation is performed. UBM is the process of plating metal layer to enhance the reliability of soldering bumps on electrode pads.

A bump formation operation is then formed to mount the solder bumps 135 to the second wafer 107. The bump formation can occur by electroplating, paste print, ball mounting, or injection molded solder (IMS), just to name a few non-exhaustive ways to attach the bumps.

An edge trimming operation may be performed on the second wafer 107 to facilitate formation of the conductive enclosure by exposing the solder bonded layer 115. Edge trimming is a technique in which a cutting wheel, which may be an annular saw having a diamond cutting surface, is used to cut along a periphery of the semiconductor in a substantially perpendicular direction to a top surface of a semiconductor wafer. The edge trimming operation may be performed by a cutting tool using a cutting wheel other than a diamond, and the edge trimming operation is not limited to being performed with a wheel-shaped cutting tool. For example, a laser may be used in lieu of a cutting wheel. In the edge trimming operation, a notch region may be created that is defined by the exposed solder bonded layer 115 attached to the first wafer 105, and a sidewall of the second wafer 107. In this illustrated embodiment, there are two wafers (105, 107) bonded together by the solder bonded layer 115. The purpose of the edge trimming operation is to trim a portion of the second wafer 107 along the edges 535 to expose the solder bonded layer 115 to facilitate electrical continuity of the solder bonded layer 115 with the solder shield material 130. In this illustrated embodiment, the solder bonded layer 115 may vary in thickness in a range of 100 nm to 1 um, and is typically about 200 nm. The thickness of the notch cut into edge the second wafer 107 may range, in a non-limiting example, from about 25 nm, to 1 um. As shown in FIG. 4, a solder shield 130 is formed at the sidewalls of the first wafer 107 and connected to the solder bonded layer 115.

A dicing operation is performed to cut the wafer into a plurality of chips 540, 545, etc. Dicing operations are understood by persons of ordinary skill as an operation to separate a die of a wafer into a plurality of chips. Laser cutting, mechanical cutting, and scribing and breaking are some examples of ways to perform dicing. The diced chips 540, 545 can then be attached to the second device 110 (e.g., non-limiting examples include a PCB, an interposer, a wiring, an interposer). However, the qubits chips 107 have the solder bumps 135 attached to the pad material 235. The solder bonded layer 115 is attached to the solder shield material 130, and the solder shield material 130 is connected to conductive lines or planes 125 in the PCB 110 as discussed herein above. It is to be understood that the dicing operation may be performed prior to the edge trimming operation, or after the edge trimming operation.

Example Process

With the foregoing overview of the example architecture, it may be helpful now to consider a high-level discussion of an example process. To that end, FIG. 6 is a flowchart illustrating a method of manufacturing a conductive structure, consistent with an illustrative embodiment.

Figure 6:
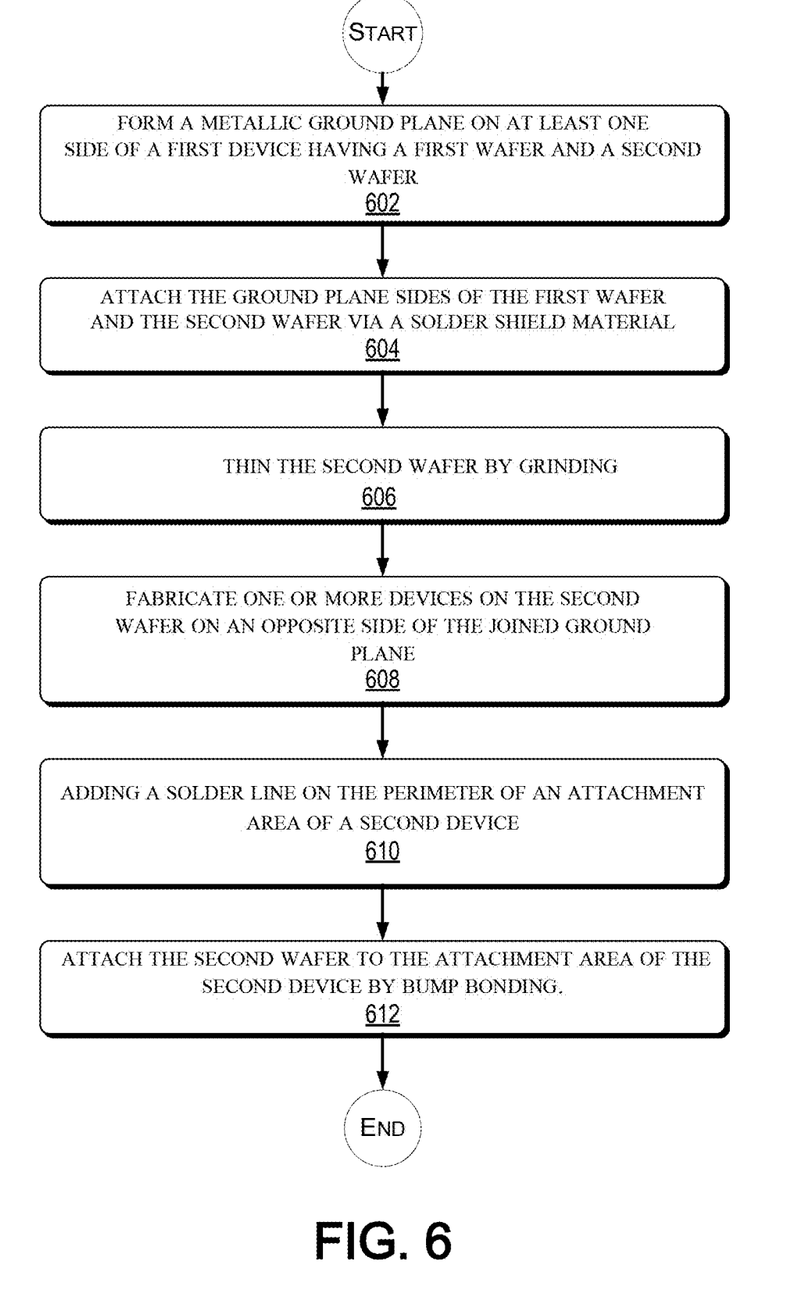
FIG. 6 is a flowchart illustrating a method of manufacturing a conductive structure, consistent with an illustrative embodiment.

FIG. 6 is shown as a collection of blocks, in a logical order, which represents a sequence of operations. In each process, the order in which the operations are described is not intended to be construed as a limitation, and any number of the described blocks can be combined in any order and/or performed in parallel to implement the process.

At operation 602, a metallic ground plane is formed on at least one side of a first wafer and a second wafer. Referring to FIG. 5A, it is shown where the metal layers 117 and 120 are formed on the respective wafers.

At operation 604, the ground plane sides of the first wafer and the second wafer are bonded via a solder shield material. FIG. 5A shows the wafer bonding with solder bonded layer 115. The ground plane is now formed of the two metal layers and the solder bonded layer 115 therebetween.

At operation 606, the optional operation of thinning the second wafer is performed. For example, a grinding operation may be performed to reduce the thickness of the second wafer (e.g., qubit chip 107).

At operation 608 one or more devices are fabricated in the second wafer on the opposite side of the joined ground planes. FIG. 5A shows the addition of devices 530 to the opposite side of the qubit chip 107.

At operation 610, conductive lines or planes 125 are added to the perimeter of an attachment area of a PCB. As shown in FIG. 1, the conductive lines or planes 125 have entry and exit points 126 to permit microwave signals to be sent to/from the devices attached to the qubit chip 107 in the conductive enclosure.

At operation 610, the second wafer is attached to a pad in the attachment area of the second device 110 by bump bonding. FIG. 4 shows the attachment of the bonding first chip 105 and qubit chip 107 to the second device 110. The method ends after operation 610.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A structure comprising:
a first device comprising a first chip and a second chip, the second chip having a first side with a plurality of bumps and a second side having a plurality of first superconducting lines;
a solder bonded layer attaching the first chip to a second side of the second chip opposite the first side;
a second device having a first side with a plurality of pads facing the plurality of bumps in the second chip and a second side of the second device opposite the first side having a plurality of second superconducting lines; and
a solder shield material surrounding the plurality of bumps and the plurality of pads, wherein the plurality of bumps on the second chip are bonded to the plurality of pads on the second device; and the solder shield material is connected to the plurality of first superconducting lines of the first device and to the plurality of second superconducting lines of the second device.

2. The structure according to claim 1, wherein the second chip comprises a qubit chip.

3. The structure according to claim 2, wherein:
the first chip comprises a handler wafer having a first attachment surface including a first metal deposition layer;
the qubit chip has a second attachment surface including a second metal deposition layer; and
the first attachment surface of the handler wafer and the second attachment surface of the qubit chip are bonded by the solder bonding layer located between the first attachment surface and the second attachment surface.

4. The structure according to claim 1, wherein the solder shield material comprises a superconducting material.

5. The structure according to claim 1, wherein the second device has metal lines or planes inside layers.

6. The structure according to claim 5, wherein the second device includes exit and entry points in the second superconducting lines sized for passage of microwave signals to the qubit chip.

7. The structure according to claim 5, wherein the metal lines or planes within the second device comprises a superconducting material.

8. The structure according to claim 1, wherein the plurality of bumps in the second chip comprises a superconducting material.

9. The structure according to claim 1, further comprising a solder shield side wall having a first end disposed on the first device.

10. The structure according to claim 9, wherein the solder shield side wall further comprises a second end connected to the second superconducting lines of the second device.

\* \* \* \* \*